US006581180B1

(12) United States Patent
Weng (10) Patent No.: US 6,581,180 B1
(45) Date of Patent: Jun. 17, 2003

(54) SYSTEM AND METHOD FOR PERFORMING A CHIEN SEARCH USING MULTIPLE GALOIS FIELD ELEMENTS

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/527,736

(22) Filed: Mar. 17, 2000

(51) Int. Cl.[7] .............................................. H03M 13/00
(52) U.S. Cl. ..................................................... 714/781
(58) Field of Search ................................ 714/781, 785, 714/782, 784

(56) References Cited

U.S. PATENT DOCUMENTS 5,001,715 A * 3/1991 Weng .......................... 714/781
6,199,188 B1 * 3/2001 Shen et al. .................. 714/782
6,260,173 B1 * 7/2001 Weng et al. ................. 714/781

* cited by examiner

*Primary Examiner*—Phung M. Chung
(74) *Attorney, Agent, or Firm*—Cesari and McKenna, LLP (57) ABSTRACT

A system for performing a Chien search simultaneously tests multiple elements of $GF(2^P)$ as possible roots of a degree-t error locator polynomial $\sigma(x)$ using a plurality of simplified multipliers that each simultaneously produce the corresponding terms of $\sigma(x)$. In one embodiment of the system, t−1 simplified multipliers over $GF(2^P)$ are used to simultaneously test as possible roots $\alpha^2, (\alpha^2)^2, (\alpha^2)^3 \ldots (\alpha^2)^j$. Each multiplier includes a plurality of adders that are set up in accordance with precomputed terms that are based on combinations of the weight-one elements of $GF(2^P)$. A summing circuit adds together the associated terms produced by the multipliers and produces j sums, which are then evaluated to test the j individual elements as possible roots. The coefficients of $\sigma(\alpha^2)^j$ are then fed back to the multipliers, and the multipliers test, during a next clock cycle, the elements $\alpha^2*(\alpha^2)^j, (\alpha^2)^2*(\alpha^2)^j \ldots, (\alpha^2)^{2j}$ and so forth. Similar multipliers also test the odd powers of $\alpha$ as roots of $\sigma'(x)=\sigma(\alpha x)$. If $P=mn$ the system may be implemented using a plurality of $GF(2^m)$ multipliers. The field $GF(2^m)$ is a subfield of $GF(2^P)$, and the elements of $GF(2^P)$ can each be represented by a combination of n elements of $GF(2^m)$. The error locator polynomial $\sigma(x)$ can thus be represented by a combination of n expressions $\sigma_0(x), \sigma_2(x) \ldots \sigma_{n-1}(x)$, each with coefficients that are elements of $GF(2^m)$. Each of the n expressions has $2^m-1$ coefficients for the terms $x^0, x^1, x^2 \ldots x^{2^m-1}$. Thus, $n(2^m-2)$ constant $GF(2^m)$ multipliers are used to test each element of $GF(2^P)$ as a possible root. The number of $GF(2^m)$ multipliers in the system is independent of the degree of the error locator polynomial, and each multiplier operates over a subfield of $GF(2^P)$. Accordingly, the system can simultaneously tests j elements using j sets of $n(2^m-2)$ constant multipliers over $GF(2^m)$.

9 Claims, 8 Drawing Sheets

SYSTEM AND METHOD FOR PERFORMING A CHIEN SEARCH USING MULTIPLE GALOIS FIELD ELEMENTS

BACKGROUND OF THE INVENTION

1. Field of the Invention

This invention relates generally to data processing systems and, more particularly, to a system for locating and correcting errors in data using an error correction code.

2. Background Information

Data stored on magnetic media, such as magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is required to correct greater numbers of errors. The speed with which the system corrects the errors is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes,* 2nd Ed. MIT Press, 1972].

To correct multiple errors in strings of data symbols, the system typically uses an ECC that efficiently and effectively utilizes the various mathematical properties of sets of symbols known as Galois fields. Galois fields are represented "GF ($S^P$)", where "S" is a prime number and "P" can be thought of as the number of digits, base "S", in each element or symbol in the field. S usually has the value 2 in digital computer and disk drive applications and, therefore, P is the number of bits in each symbol. The ECC's commonly used with the Galois Fields are Reed Solomon codes or BCH codes.

There are essentially four major steps in decoding a corrupted code word of a Reed-Solomon code or a BCH code. The system first determines error syndromes that are based on the results of a manipulation of the ECC symbols. Next, using the error syndromes, the system determines an error locator polynomial, which is a polynomial that has the same degree as the number of errors. The system then finds the roots of the error locator polynomial and from each root determines the location of an associated error in the code word. Finally, the system finds error values for the error locations. In binary codes, there is only one possible error value for an error location, and thus, the step of determining error values is trivial.

The steps of determining the syndromes and finding the error locations are the most time consuming in the error correction process. The invention described herein reduces the time it takes the error correction system to find the error locations, which involves finding the roots of degree-t error locator polynomials In many systems the roots of the error locator polynomials are determined by trial and error. The trial and error method is performed by substituting into the polynomial every possible value, i.e., every element of the applicable GF($2^P$) that is associated with a code word location, and for each value evaluating the polynomial. If the polynomial equals zero for a given value, the value is a root. The system continues the trial and error process by substituting a next possible value into the polynomial and determining if that value is a root; and so forth, until either all possible values have been tried or all t roots are determined. This trial and error process, which in an optimized form is commonly known as a Chien search, is time consuming. The time taken to perform the Chien search slows the error correction operations, and thus, the data processing operations of the system.

One way to speed up the Chien search is to test multiple elements simultaneously. However, as discussed with reference to FIG. 1 below, this requires including in the conventional system t-1 additional GF($2^P$) multipliers for each additional element tested. To test "j" elements simultaneously, the system requires j(t-1) GF($2^P$) multipliers, and the system thus readily becomes complex.

SUMMARY OF THE INVENTION

A system for performing a Chien search simultaneously tests multiple elements of GF($2^P$) as possible roots of a degree-t error locator polynomial σ(x) using in one embodiment t-1 simplified multipliers that each simultaneously produce the corresponding terms of σ(x) to test as possible roots $α^2$, $(α^2)^2$, $(α^2)^3$ ... $α^{2j}$. Each multiplier includes a plurality of adders that are set up in accordance with precomputed terms that are based on combinations of the weight-one elements of GF($2^P$). A summing circuit adds together the associated terms produced by the multipliers and produces j multiple sums, which are then evaluated to test the j individual elements as possible roots. The coefficients of σ($α^2$)$^i$ are then fed back to the multipliers, and the multipliers test, during a next clock cycle, the elements $α^{2*}(α^2)^i$, $(α^2)^{2*}(α^2)^i$ ... , $(α^2)^{2j}$ and so forth. The same operations are also performed for σ'(x)=σ(αx) to test as possible roots $α^3$, $α^5$, $α^7$ ... $α^{2j+1}$.

If P=mn, that is, if P is not prime, the system may be implemented using a plurality of GF($2^m$) multipliers. The field GF($2^m$) is a subfield of GF($2^P$), and the elements of GF($2^P$) can each be represented by a combination of n elements of GF($2^m$). The error locator polynomial σ(x) can thus be represented by a combination of n expressions $σ_0(x)$, $σ_2(x)$ ... $σ_{n-1}(x)$, each with coefficients that are elements of GF($2^m$). Each of the n expressions has $2^m-1$ coefficients for the terms $x^0$, $x^1$, $x^2$ ... $x^{2m-1}$. Thus, n($2^m-2$) constant GF($2^m$) multipliers are used to test each element of GF($2^P$) as a possible root, as discussed in more detail below.

The number of GF($2^m$) multipliers in the system is independent of the degree of the error locator polynomial, and each multiplier operates over a subfield of GF($2^P$). Accordingly, the system can simultaneously tests j elements using j sets of n($2^m-2$) multipliers over GF($2^m$). This is in contrast to conventional Chien search systems that require j(t-1) multipliers over GF($2^P$) to simultaneously test j elements.

BRIEF DESCRIPTION OF THE DRAWINGS

The invention description below refers to the accompanying drawings, of which.

DETAILED DESCRIPTION OF AN ILLUSTRATIVE EMBODIMENT

A. A Conventional System

Figure 1:
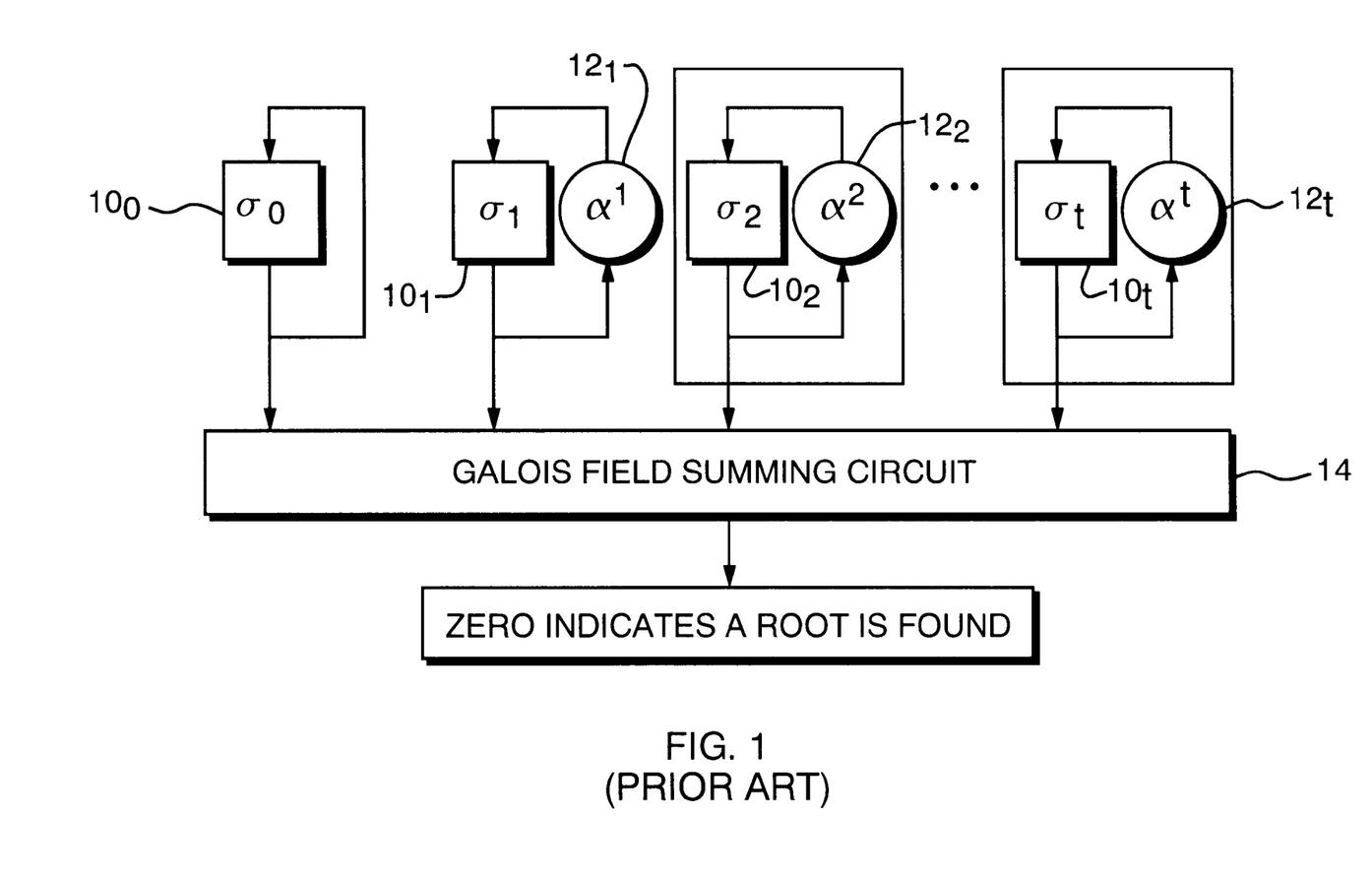
FIG. 1 is a functional block diagram of a conventional Chien search system.

To determine error locations in a code word over $GF(2^P)$, a conventional Chien search is performed by individually testing the elements of the Galois Field $GF(2^P)$ as roots of an associated error locator polynomial. For an error locator polynomial $$\sigma(x) = \sigma_t x^t + \sigma_{t-1} x^{t-1} \ldots + \sigma_1 x + \sigma_0$$

the conventional Chien search system is depicted in FIG. 1. During each clock cycle the registers $10_1 \ldots 10_t$ are updated once by multiplying their contents by the corresponding powers of $\alpha$ in $GF(2^P)$ multipliers $12_1, 12_2, \ldots 12_t$. A summing circuit 14 adds the contents of the registers $10_0, 10_1 \ldots 10_t$, and the system determines, in clock cycle "i," that the element $\alpha^i$ of $GF(2^P)$ is a root if the associated sum produced by the summing circuit 14 is zero.

More specifically the registers $10_0 \ldots 10_t$ are initially loaded with the corresponding coefficients $\sigma_0, \ldots \sigma_t$ and in a first clock cycle, at time k=0, the field element $x=\alpha^0=1$ is tested by calculating in the summing circuit 14 the sum $\sigma_t + \sigma_{t-1} + \ldots + \sigma_1 + \sigma_0$. In the next cycle, at time k=1, the contents of the registers are updated by multiplying them by the associated powers of $\alpha$ in the multipliers $12_1, 12_2 \ldots 12_t$, and a next sum is calculated by the summing circuit 14 to test the element $x=\alpha^1$. In the next clock cycle, the element $x=\alpha^2$ is tested by again multiplying the contents of the registers by the associated powers of $\alpha$ and adding the results. In the $i^{th}$ clock cycle, the circuit tests the element $\alpha^i$ as a root, and so forth. The Chien search system of FIG. 1 thus takes a maximum of $k=2^P-1$ clock cycles to find the t non-zero roots.

One way to speed up the Chien search is to simultaneously test multiple field elements as possible roots. To do this using the system of FIG. 1, however, a set of t−1 $GF(2^P)$ multipliers must be included in the system for each additional element tested. Accordingly, 2(t−1) $GF(2^P)$ multipliers must be included in the systems to test two elements simultaneously, 3(t−1) $GF(2^P)$ multipliers to test three elements, and so forth. To test even two roots simultaneously, the system is thus relatively complex. Discussed below is a system that uses fewer and/or simpler multipliers to simultaneously test multiple field elements as possible roots of the error locator polynomial.

B. A Chien Search System With Simplified Multipliers

An element of a Galois Field $GF(2^P)$ can be represented either as a degree-(p−1) polynomial $$b_{p-1} x^{p-1} + b_{p-2} x^{p-2} + \ldots + b_1 x + b_0$$

or as a p component binary vector $(b_{p-1}, b_{p-2}, \ldots b_1, b_0)$ that contains the coefficients of the degree-(p−1) polynomial.

For a Galois Field $GF(2^6)$ which is generated as successive powers of x mod $x^6+x+1$, the field elements in vector form are:

$$\alpha^0 = 1 = (000001)$$

$$\alpha^1 = x = (000010)$$

$$\alpha^2 = x^2 = (000100)$$

$$\alpha^3 = x^3 = (001000)$$

$$\alpha^4 = x^4 = (010000)$$

$$\alpha^5 = x^5 = (100000)$$

$$\alpha^6 = x+1 = (000011) = (000010) + (000001)$$

$$\alpha^7 = x^2+x = (000110) = (000100) + (000010) \ldots$$

$$\alpha^{62} = x^5+1 = (100001) = (100000) + (000001)$$

$$\alpha^{63} = \alpha^0 = 1 = (000001)$$

Any element $c = (c_5 c_4 c_3 c_2 c_1 c_0)$ of $GF(2^6)$ can be represented by a sum of the weight-one elements of $GF(2^6)$:

$$c = (c_5 00000) + (0c_4 0000) + (00c_3 000) + (000c_2 00) + (0000c_1 0) + (00000c_0).$$

Multiplication operations involving two Galois Field elements $\alpha^i = (a+b)$ and $\alpha^j$ can be performed as:

$$\alpha^i * \alpha^j = (a+b) * \alpha^j = a * \alpha^j + b * \alpha^j$$

where + and * represent Galois Field addition and multiplication operations, respectively.

Accordingly, the multiplication of $c * \alpha^j$ can then be performed as: $(c_5 00000) * \alpha^j + (0c_4 0000) * \alpha^j + (00c_3 000) * \alpha^j + (000c_2 00) * \alpha^j + (0000c_1 0) * \alpha^j + (00000c_0) * \alpha^j$.

For multiplication of the element c by a constant, such as $\alpha^j = \alpha^2$, the terms of the product, which are elements of $GF(2^6)$, can be precomputed as:

$$c_5*(100000)*\alpha^2 + c_4*(010000)*\alpha^2 + c_3*(100000)*\alpha^2 + c_2*(010000)*\alpha^2 + c_1*(100000)*\alpha^2 + c_0*(01000)*\alpha^2$$

multiplying the terms out:

$$c_5*[\alpha^5*\alpha^2] = c_5*(\alpha^7) = c_5*(000110) = c_5*(000100) + c_5*(000010)$$

$$c_4*[\alpha^4*\alpha^2] = c_4*(\alpha^6) = c_4*(000110) = c_4*(000010) + c_4*(000001)$$

$$c_3*[\alpha^3*\alpha^2] = c_3*(\alpha^5) = c_3(100000)$$

$$c_2*[\alpha^2*\alpha^2] = c_2*(\alpha^4) = c_2(010000)$$

$$c_1*[\alpha^1*\alpha^2] = c_1*(\alpha^3) = c_1(001000)$$

$$c_0*[\alpha^0*\alpha^2] = c_0*(\alpha^2) = c_0(000100)$$

and combining like terms the product becomes:

$$c*\alpha^2 = c_3\alpha^5 + c_2\alpha^4 + c_1\alpha^3 + (c_0+c_5)\alpha^2 + (c_4+c_5)\alpha^1 + c_4$$

or in matrix form $$(c_5 c_4 c_3 c_2 c_1 c_0) \begin{bmatrix} 000110 \\ 000011 \\ 100000 \\ 010000 \\ 001000 \\ 000100 \end{bmatrix} = c * A = (e_5 e_4 e_3 e_2 e_1 e_0)$$

Figure 2:
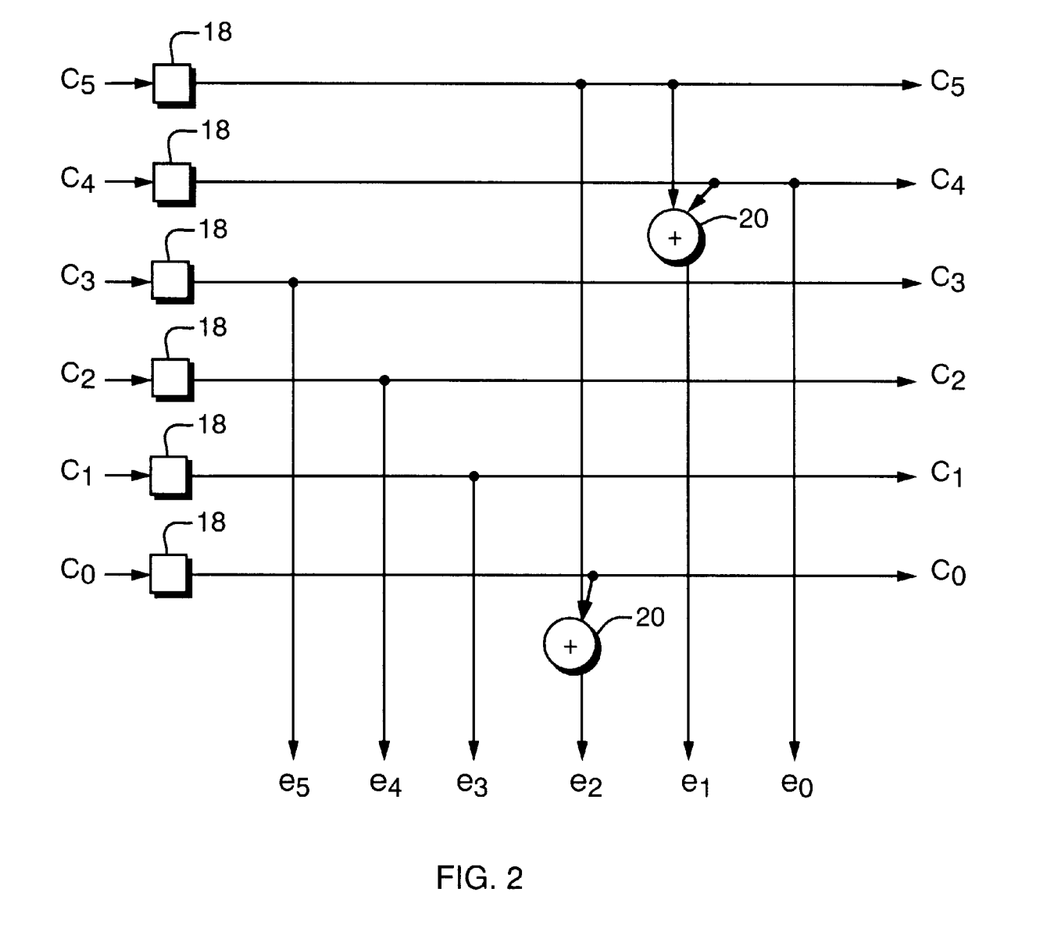
FIG. 2 is a functional block diagram of a constant multiplier over $GF(2^P)$.

A Galois Field multiplier that multiplies a field element by the constant $\alpha^2$ over $GF(2^6)$ can thus be implemented by the circuit shown in FIG. 2. As shown in the drawing, the coefficients of c are supplied through registers 18 to Galois Field adders or XOR gates 20. The adders are arranged to add the coefficients together in accordance with the matrix A. The updated coefficients $e_5 \ldots e_0$ are then fed back to the registers 18, and in a next clock cycle the multiplier produces $e*\alpha^2 = c*\alpha^4$.

To calculate $(c*\alpha^2)*\alpha^2$ or $c*\alpha^4$, the terms $c*\alpha^2$ are each multiplied by $\alpha^2$:

$$[c_3\alpha^5]*\alpha^2 + [c_2\alpha^4]*\alpha^2 + [c_1\alpha^3]*\alpha^2 + [(c_0+c_5)*\alpha^2]*\alpha^2 + [(c_4+c_5)*\alpha^1]*\alpha^2 + [c_4]*\alpha^2$$

Multiplying out the terms:

$$c_3[\alpha^7] = c_3(000110) = c_3*(000100) + c_3*(000010)$$

$$c_2[\alpha^6] = c_2(000011) = c_2*(000010) + c_2*(000001)$$

$$c_1[\alpha^5] = c_1(100000)$$

$$(c_0+c_5)[\alpha^4] = c_0(010000) + c_5(010000)$$

$$(c_4+c_5)[\alpha^3] = c_4(001000) + c_5(001000)$$

$$c_4[\alpha^2] = c_4(000100)$$

and combing like terms the product becomes:

$$c*\alpha^4 = c_1\alpha^5 + (c_0+c_5)\alpha^4 + (c_4+c_5)\alpha^3 + (c_3+c_4)\alpha^2 + (c_3+c_2)\alpha^1 + c_2$$

or in matrix form $$(c_5 c_4 c_3 c_2 c_1 c_0) \begin{bmatrix} 011000 \\ 001100 \\ 000110 \\ 000011 \\ 100000 \\ 010000 \end{bmatrix} = c * B = (f_5 f_4 f_3 f_2 f_1 f_0)$$

Similarly, the product $c*\alpha^4*\alpha^2$ or $c*\alpha^6$ can be calculated by multiplying the terms of the previous product by $\alpha^2$:

$$[c_1\alpha^5]*\alpha^2 + [(c_0+c_5)\alpha^4]*\alpha^2 + [(c_4+c_5)\alpha^3]*\alpha^2 + [(c_3+c_4)\alpha^2]*\alpha^2 + [(c_3+c_2)\alpha^1]*\alpha^2 + [c_2]\alpha^2$$

and combining like terms:

$$(c_4+c_5)\alpha^5 + (c_3+c_4)\alpha^4 + (c_2+c_3)\alpha^3 + (c_1+c_2)\alpha^2 + (c_0+c_1+c_5)\alpha^1 + (c_0+c_5)\alpha^0$$

which in matrix form is:

$$(c_5 c_4 c_3 c_2 c_1 c_0) \begin{bmatrix} 100011 \\ 110000 \\ 011000 \\ 001100 \\ 000110 \\ 000011 \end{bmatrix} = c * C = (g_5 g_4 g_3 g_2 g_1 g_0)$$

Figure 3:
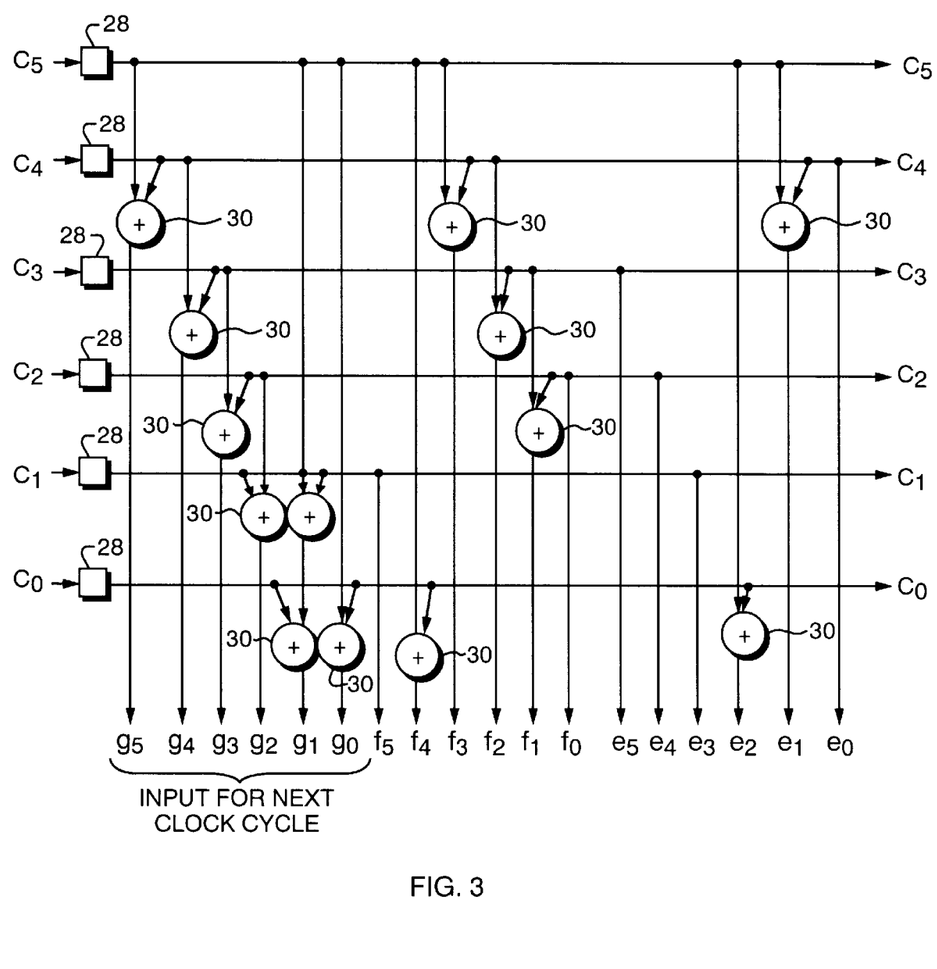
FIG. 3 is a functional block diagram of a combined $GF(2^P)$ for simultaneously multiplying multiple coefficients by a constant multiplier.

The three multiplication operations can then be performed simultaneously by the single matrix multiplication $$(c_5 c_4 c_3 c_2 c_1 c_0) \begin{bmatrix} 100011 & \cdots & 011000 & \cdots & 000110 \\ 110000 & \cdots & 001100 & \cdots & 000011 \\ 011000 & \cdots & 000110 & \cdots & 000011 \\ 001100 & \cdots & 000011 & \cdots & 010000 \\ 000110 & \cdots & 100000 & \cdots & 001000 \\ 000011 & \cdots & 010000 & \cdots & 000100 \end{bmatrix} =$$

$$(g_5 g_4 g_3 g_2 g_1 g_0), (f_5 f_4 f_3 f_2 f_1 f_0), (e_5 e_4 e_3 e_2 e_1 e_0)$$

which can be implemented in a single combination multiplier circuit as depicted in FIG. 3. The coefficients of c are supplied through registers 28 to adders or XOR gates 30 that are arranged in accordance with the matrix. To perform further multiplication operations, the coefficients $g_5 \ldots g_0$ of the product $c*\alpha^6$ are fed back to the registers 28, and in a next clock cycle the adders 30 produce the three products $c*\alpha^8$, $c*\alpha^{10}$ and $c*\alpha^{12}$, and so forth.

The combination multiplier circuit of FIG. 3 can be simplified by eliminating certain adders 30 that correspond to duplicate matrix columns. For example, the columns that produce the coefficients $g_5$, $f_3$ and $e_1$ are identical and the three coefficients can thus be produced by a single adder, or XOR gate. Further simplification may also be realized in certain multipliers by producing coefficients as sums of other coefficients.

Figure 4:
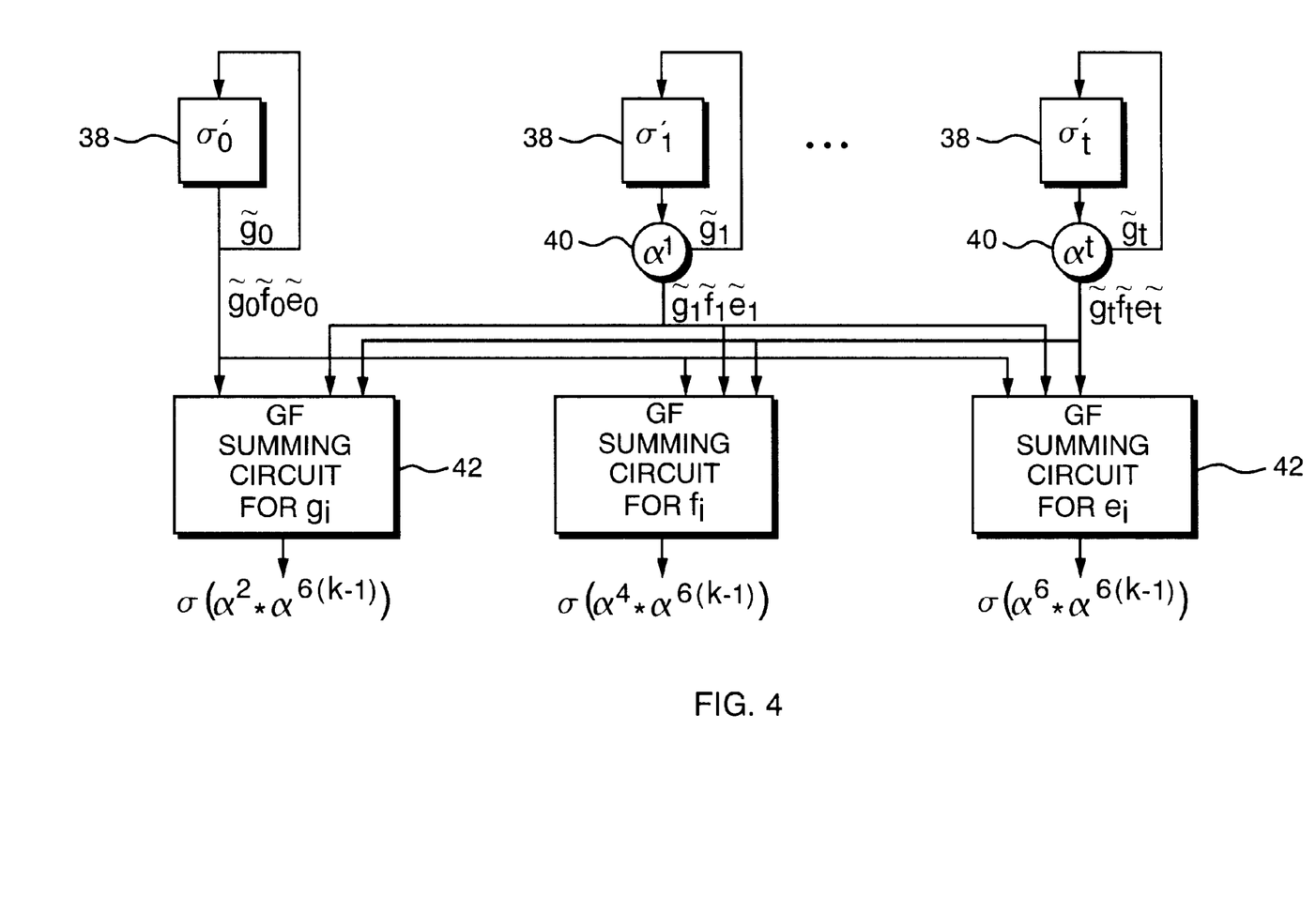
FIG. 4 is a functional block diagram of a Chien Search circuit that uses the multipliers of FIG. 3.

As depicted in FIG. 4, a Chien search circuit that simultaneously tests three roots, for example, $\alpha^2$, $\alpha^4$, and $\alpha^6$ may be implemented using t-1 multipliers 40 that are each the simplified Galois Field multipliers discussed above with reference to FIG. 3. Accordingly, each multiplier 40 includes a minimal set of adders 30 (FIG. 3) that are arranged in accordance with the precomputed terms $\sigma'_0, \sigma'_1 \ldots \sigma'_t$ of the products $\sigma(x)$ for $x=\alpha^2$, $\alpha^4$ and $\alpha^6$, where $\sigma'_0$ represents the precomputed term of $x^0$ and so forth. A summer circuit 42 evaluates the three elements as possible roots by adding together the corresponding terms produced by the multipliers 40 to produce three associated sums. If the sum $\sigma(\alpha^2)=0$, $\alpha^2$ is a root. Similarly, if the sum $\sigma(\alpha^4)=0$, $\alpha^4$ is a root, and so forth. The coefficients $g_5 \ldots g_0$ of $\sigma(\alpha^6)$ are then fed back to the registers 38, and multipliers in a next clock cycle test the next set of three roots $\alpha^8$, $\alpha^{10}$ and $\alpha^{12}$ and so forth.

A similar circuit is used to test the odd powers of $\alpha$ as roots of $\sigma'(x) = \sigma(\alpha x)$.

C. A Chien Search System Utilizing Subfields

Even further simplification of the Chien search system of FIG. 4 can be realized if the Galois Field is of the form $GF(2^{mn})$, and m and n are both small values. The Galois Field $GF(2^6)$, for example, can be expressed as $GF((2^2)^3)$ with m=2 and n=3 or $GF((2^3)^2)$ with m=3 and n=2, where $GF(2^2)$ and $GF(2^3)$ are subfields of $GF(2^6)$.

The field $GF(2^6)$ is isomorphic to a field $GF((2^3)^2)$ generated by the irreducible polynomial $x^2+x+1$. The subfield $GF(2^3)$ has a primitive element $\beta$, and is generated as successive powers of $\beta$ mod $\beta^3+\beta+1$. The elements of $GF(2^3)$ are:

$\beta^0=(001)$
$\beta^1=(010)$
$\beta^2=(100)$
$\beta^3=(011)$
$\beta^4=(110)$
$\beta^5=(111)$
$\beta^6=(101)$ and all the elements of $GF(2^6)$ can be expressed as integer powers of $\gamma$, where $\gamma^k=\beta^i x+\beta^j$. For a properly selected $\gamma$, there is a one-to-one correspondence between $\gamma^k$ and $\alpha^j$, where $\alpha$ is the primitive element of $GF(2^6)$.

One choice for $\gamma$ is $\gamma=\beta x+1$. The successive powers of $\gamma$, which can be represented as vectors of the form $(\beta^i, \beta^j)$, are:

$$0=(000, 000)=(0,0)$$

$$1=\gamma^0=(000, 001)=(0, \beta^0)$$

$$\gamma=\beta x+1(010, 001)=(\beta^1, \beta^0)$$

$$\gamma^2=(\beta x+1)(\beta x+1)=(100, 101)=(\beta^2, \beta^6)$$

$$\gamma^3=(\beta^2 x+\beta^6)(\beta x+1)=(110, 110)=(\beta^4, \beta^4)\ldots$$

$$\gamma^9=(000, 111)=(0, \beta^5)\ldots$$

$$\gamma^{18}=(000, 011)=(0, \beta^3)\ldots$$

$$\gamma^{62}=(\beta^3 x+\beta^5)=(011, 111)=(\beta^3, \beta^5)$$

Multiplication over $GF(2^6)$, for elements $\gamma^j$ of the form $(0, \beta^5)$, can performed as the sum of two multiplication operations over $GF(2^m)$. Specifically, the multiplication of $\gamma^k=(\beta^a, \beta^b)=\beta^a x+\beta^b$ and $\gamma^9=(0, \beta^5)=0x+\beta^5$, may be performed as:

$$\gamma^{k}*\gamma^9=(\beta^a x+\beta^b)*\beta^5=[(\beta^5 *\beta^a)x]+\beta^5 *\beta^b=(\beta^{a*}\beta^5, \beta^{b*}\beta^5).$$

Letting $\beta^a=d_1$ and $\beta^b=d_0$, the terms $d_1$ and $d_0$, which are elements of $GF(2^3)$, can be represented as corresponding elements of $GF(2^6)$ by $(d_1, 0)$ and $(0, d_0)$. The multiplication operation of $\gamma^k$ by the constant $\gamma$ is then:

$$\gamma^{k}*\gamma=(d_1, 0)*\gamma+(0, d_0)*\gamma=d_1 *(1,0)*\gamma+d_0 *(0,1)*\gamma$$

The element $(1,0)$ in vector form is $(001, 000)=\gamma^{42}$ and the element $(0,1)$ is $(000, 001)=\gamma^0$. The product thus becomes $$(d_1 *\gamma^{42}*\gamma)+(d_0 *\gamma^0 *\gamma)=d_1 \gamma^{43}+d_0 \gamma=(h_1, h_0)$$

or in matrix form $$(d_1, d_0)\begin{bmatrix} \beta^3 - \beta \\ \beta \ldots 1 \end{bmatrix} = (h_1, h_0)$$

with $\gamma^{43}=\beta^3 x+\beta$ and $\gamma=\beta x+1$.

The product $\gamma^{k}*\gamma^2$ is $(h_1,h_0)*\gamma=d_1 *\gamma^{44}+d_0 *\gamma^2=(m_1, m_0)$, and the product $\gamma^{k}*\gamma^3$ is $(m_1, m_0)*\gamma=d_1 *\gamma^{45}+d_0 *\gamma^3=(n_1, n_0)$.

The three multiplication operations can then be performed simultaneously by a single matrix multiplication operation as $$d_1, d_0 \begin{bmatrix} \beta^3 & \beta & 1 & \beta^2 & 0 & \beta^4 \\ \beta & 1 & \beta^2 & \beta^6 & \beta^4 & \beta^4 \end{bmatrix} = (h_1, h_0, m_1, m_0, n_1, n_0)$$

Figure 5:
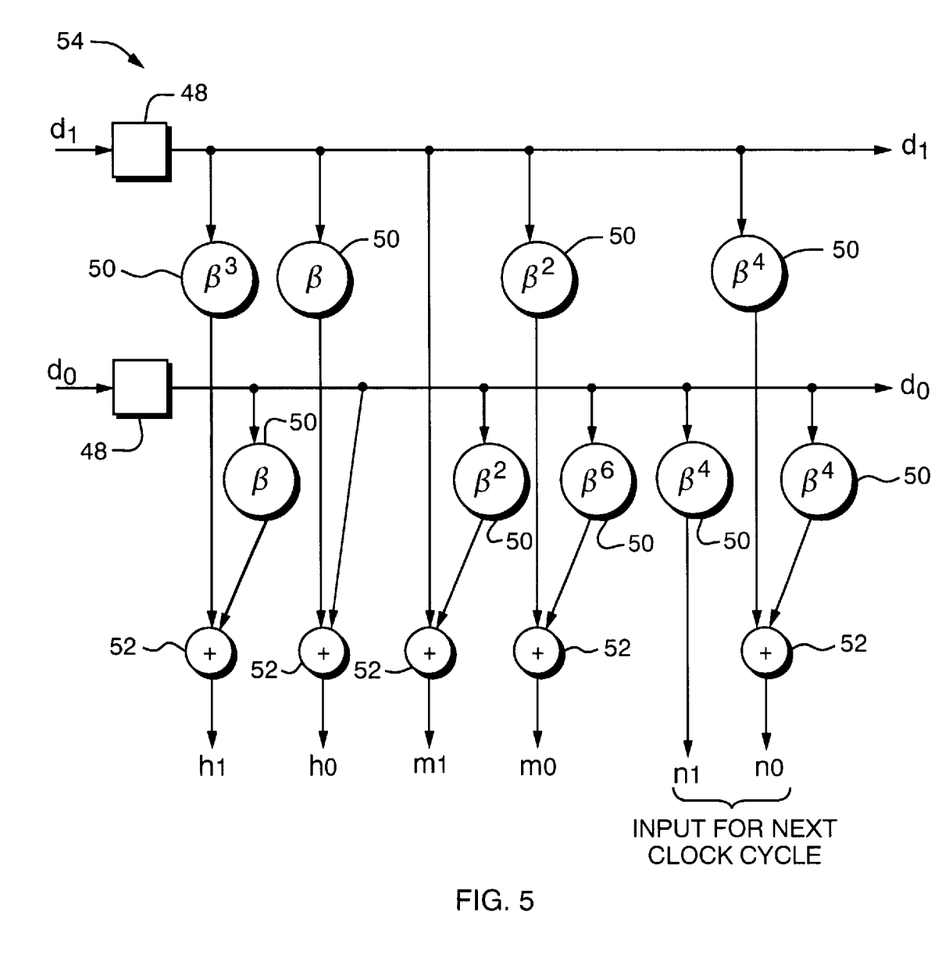
FIG. 5 is a functional block diagram of a combined multiplier that uses elements is of $GF(2^m)$.

A combined multiplier circuit that simultaneously produces the three products $\gamma^{k}*\gamma$, $\gamma^{k}*\gamma^2$ and $\gamma^{k}*\gamma^3$ can be implemented as depicted in FIG. 5, in which the XOR gates of FIG. 3 are replaced with constant $GF(2^3)$ multipliers 50. The coefficients $n_1, n_0$ are fed back to registers 48, and the multiplier circuit in a next cycle produces $\gamma^{k}*\gamma^4$, $\gamma^{k}*\gamma^5$, and $\gamma^{k}*\gamma^6$, and so forth.

The multiplier circuit of FIG. 5 can be simplified by eliminating duplicate multipliers 50. For example, one of the multipliers 50 associated with the $n_0$ term can be eliminated by using the product $d_0\beta^4$ produced for $n_1$ also in the sum associated with $n_0$.

Figure 6:
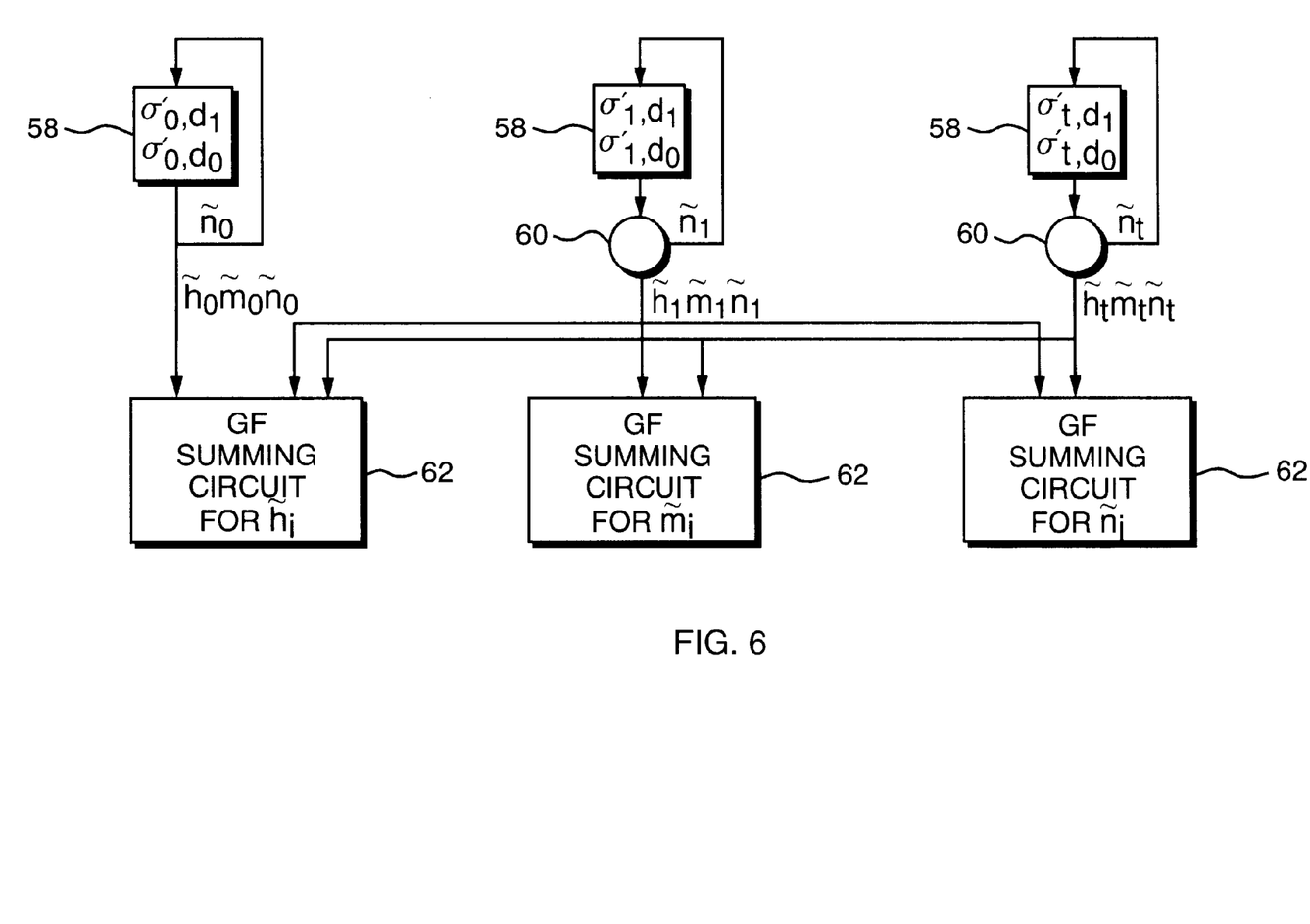
FIG. 6 is a functional block diagram of a Chien Search circuit that uses the multipliers of FIG. 5.

A Chien search system for simultaneously testing three elements of $GF(2^P)$ as roots of the error locator polynomial $\sigma(x)$ over $GF(2^{mn})$ using constant $GF(2^m)$ multipliers 60 is depicted in FIG. 6. The multipliers 60 are each the simplified multipliers discussed above with reference to FIG. 5.

The values $\sigma'_t, \sigma'_{t-1} \ldots \sigma'_0$ in the form $\beta^a, \beta^b$ are supplied to multipliers 60 and at time k=1, the system simultaneously tests $\gamma, \gamma^2, \gamma^3$ as possible roots. By feeding back to the registers 58 the associated updated coefficients $n_1, n_0$ produced by the respective multipliers, which are represented in the drawing as $n_i$, the system in a next iteration at time k=k+1, tests $\gamma^{*}\gamma^{3(k-1)}, \gamma^{2}*\gamma^{3(k-1)}$ and $\gamma^{3}*\gamma^{3(k-1)}$. The system thus takes a maximum of $$\frac{2^P - 1}{3}$$

cycles to test all non-zero elements of $GF(2^6)$.

D. A Chien Search System With Fewer Simplified Multipliers

To further optimize the system of FIG. 6, various properties of subfields are utilized.

The updated coefficients are, by definition, elements of $GF(2^3)^2$, or more generally, $GF(2^{mn})$. Accordingly, the updated coefficient $\sigma_j^{(k)}$ can be expressed as an n-term expression of elements of $GF(2^m)$, where (k) is a time index. In the example, $\sigma_j^{(k)}$ can be expressed as $\beta^i x+\beta^q$, where $\beta^i$ and $\beta^q$ are elements of $GF(2^3)$. The updated coefficient in matrix form is $$\sigma_j^{(k)} = \begin{bmatrix} \beta^i \\ \beta^q \end{bmatrix} = \begin{bmatrix} \sigma_{j,1}^{(k)} \\ \sigma_{j,0}^{(k)} \end{bmatrix}$$

When $\sigma_j^{(k)}$ is multiplied by an element $\gamma^{r*n}$, where $$r = \frac{2^{nm} - 1}{2^m - 1}$$

and $\gamma^{r*n}$ is of the form $(0,\beta^W)$, the result is $$\sigma_j^{(k)} * \gamma^{r*n} = \begin{bmatrix} \sigma_{j,1}^{(k)} * \gamma^{r*n} \\ \sigma_{j,0}^{(k)} * \gamma^{r*n} \end{bmatrix} = \begin{bmatrix} \sigma_{j,1}^{(k)} * \beta^W \\ \sigma_{j,0}^{(k)} * \beta^W \end{bmatrix}$$

In the example, $$r = \frac{2^6 - 1}{2^3 - 1} = 9, \quad \gamma^{r*n} = \gamma^{9*2} = \gamma^{18} = (000, 011) = \beta^3,$$

and the complete multiplication operation involves individual multiplications of $\sigma_{j,1}$ and $\sigma_{j,2}$, which are elements of $GF(2^m)$, by $\beta^3$, which is also an element of $GF(2^m)$.

The testing of elements of the form $\gamma^{r*n}$ as roots can be performed by evaluating n=2 expressions using multiplication operations over $GF(2^3)$ as follows:

$$\sigma_1^{(k)}(x)=\sigma_{t,1}x^t+\sigma_{t-1,1}x^{t-1}+ \ldots +\sigma_{1,1}x+\sigma_{0,1}$$

$$\sigma_0^{(k)}(x) = \sigma_{t,0} x^t + \sigma_{t-1,0} x^{t-1} + \ldots + \sigma_{1,0} x + \sigma_{0,0}$$

where the time index has been dropped for ease of understanding.

Assuming the degree of the error locator polynomial is greater than $v = 2^m - 1$, that is, greater than the number of non-zero elements of $GF(2^m)$, the expression $\sigma_0(x)$ can be rewritten:

$$(\sigma_{0,0} + \sigma_{v,0} + \sigma_{2v,0} + \ldots)x^0 + (\sigma_{1,0} + \sigma_{v+1,0} + \sigma_{2v+1,0} + \ldots)x^1 + \ldots + (\sigma_{v-1,0} \sigma_{2v-1,0} + \ldots)x^{v-1}$$

since $x^v = 1$ in $GF(2^m)$. A single element or $\gamma^{r^*n} * \gamma^i$ of $GF(2^6)$ can be tested as a "roof" of the degree t polynomial $\sigma_0(x)$ using $v - 1 = 2^m - 2$ $GF(2^m)$ constant multipliers over $GF(2^m)$. The same number of multipliers are needed to test the same element as a "root" of $\sigma_1(x)$. Accordingly, a total of $2(v-2)$ constant multipliers over $GF(2^m)$ is needed to test an element of $GF(2^6)$ as a root of $\sigma(x)$. The number of multipliers thus depends on the selected subfield, and not on the degree of $\sigma(x)$. If the subfield $GF(2^n)$ is selected instead of $GF(2^m)$, the system requires $m(2^n - 2)$ multipliers that operate over $GF(2^n)$.

In the example, the roots of an error locator polynomial $\sigma(x) = \sigma_{13} x^{13} + \sigma_{12} x^{12} + \sigma_{11} x^{11} + \sigma_{10} x^{10} + \sigma_9 x^9 + \sigma_8 x^8 + \sigma_7 x^7 + \sigma_6 x^6 + \sigma_5 x^5 + \sigma_4 x^4 + \sigma_3 x^3 + \sigma_2 x^2 + \sigma_1 x^1 + \sigma_0$ can be determined using the expressions $\sigma_1(x)$ and $\sigma_0(x)$ and multiplication operations over $GF(2^3)$. In $GF(2^3)$, $x^7 = 1$, and the expression $\sigma_0(x)$ can be rewritten as $$\sigma_0(x) = \sigma_{13,0} x^6 + \sigma_{12,0} x^5 + \sigma_{11,0} x^4 + \sigma_{10,0} x^3 + \sigma_{9,0} x^2 + \sigma_{8,0} x^1 + \sigma_{7,0} x^0 + \sigma_{6,0} x^6 + \sigma_{5,0} x^5 + \sigma_{4,0} x^4 + \sigma_{3,0} x^3 + \sigma_{2,0} x^2 + \sigma_{1,0} x + \sigma_{0,0}$$

Combining like terms, the expression becomes:

$$\sigma_0(x) = (\sigma_{13,0} + \sigma_{6,0})x^6 + (\sigma_{12,0} + \sigma_{5,0})x^5 + (\sigma_{11,0} + \sigma_{4,0})x^4 + (\sigma_{10,0} + \sigma_{3,0})x^3 + (\sigma_{9,0} + \sigma_{2,0})x^2 + (\sigma_{8,0} + \sigma_{7,0})x + \sigma_{0,0}$$

A system for iteratively testing an element of the form $(\gamma^{r^*n}) * \gamma^i$ as a root of $\sigma(x)$ is then implemented using $v - 1$ $GF(2^3)$ multipliers for each of $\sigma_1(x)$ and $\sigma_0(x)$, or 12 $GF(2^3)$ multipliers. The $GF(2^3)$ multipliers are less complex than $GF(2^6)$ multipliers, requiring fewer XOR gates, and the system is thus less complex than the system of FIG. 1, which uses t−1 or 12 $GF(2^6)$ multipliers.

Figure 7:
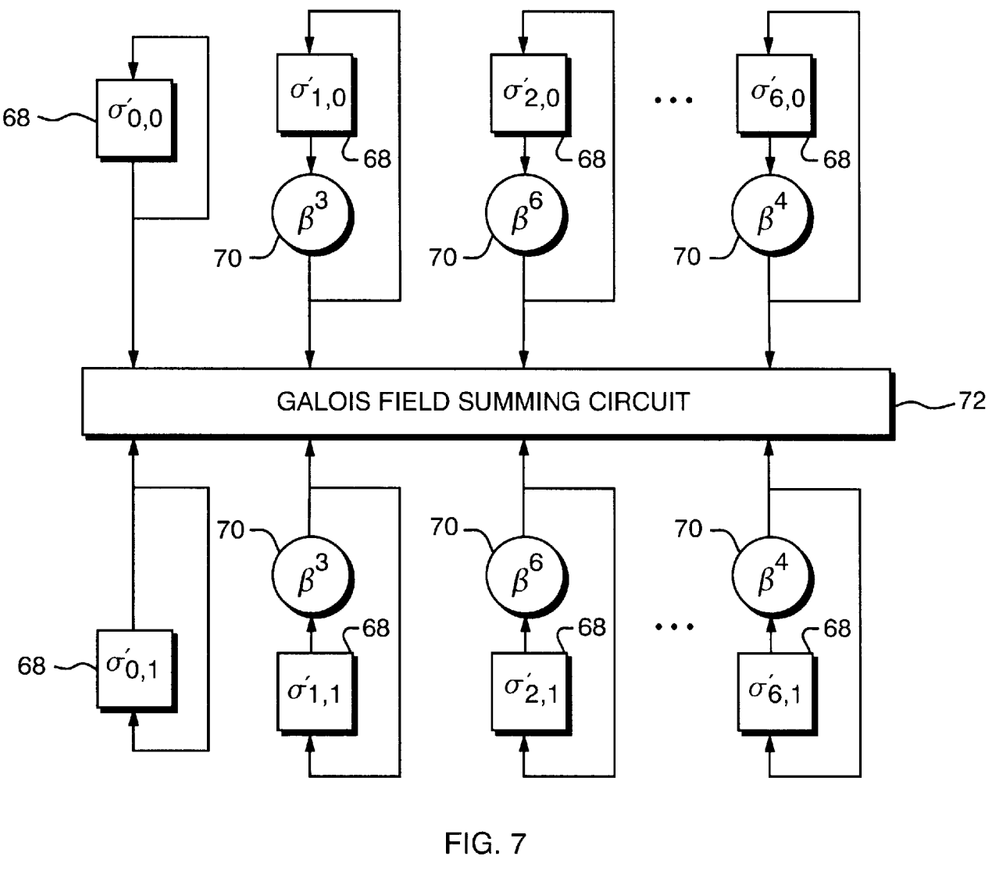
FIG. 7 is a functional block diagram of a Chien Search circuit that uses fewer $GF(2^m)$ multipliers.

FIG. 7 depicts a Chien search system for use over $GF(2^3)^2$, where roots of the form $(\gamma^{r^*n}) * \gamma^i$ are tested. The coefficient terms $\sigma'_{0,0}$; $\sigma'_{1,0} = (\sigma_{8,0} + \sigma_{7,0}) \ldots \sigma'_{6,0} = (\sigma_{13,0} + \sigma_{6,0})$ and $\sigma'_{0,1} = \sigma_{0,1}$; $\sigma'_{1,1} = (\sigma_{8,1} + \sigma_{7,1}) \ldots \sigma'_{6,1} = (\sigma_{13,1} + \sigma_{6,1})$ are supplied through registers 68 to multipliers 70, which multiply the coefficient terms by the appropriate elements of $GF(2^m)$. The multipliers in the exemplary system are thus $\gamma^{18} = \beta^3$ for the x term; $(\gamma^{18})^2 = \beta^6$ for the $x^2$ term; $(\gamma^{18})^3 = \beta^2$ for the $x^3$ term; $(\gamma^{18})^4 = \beta^5$ of the $x^4$ term; $(\gamma^{18})^5 = \beta$ for the $x^5$ term and $(\gamma^{18})^6 = \beta^4$ for the $x^6$ term. The multipliers for the terms of $\sigma_1(x)$ are multipliers 70 that correspond to the elements $\gamma^j$ of the form $(\beta^1, 0)$ such as $\gamma^{60} = (\beta^3, 0)$, and so forth. The summing circuit 72 produces the sum or sums that are examined to test the elements of $GF(2^6)$ as possible "roots" of $\sigma_0(x)$ and $\sigma_1(x)$. The roots of $\sigma(x)$ are those elements $\gamma^i (\gamma^{r^*n}) = \beta^a x + \beta^b$ that produce sums of zero for both $\sigma_1(\beta^a)$ and $\sigma_0(\beta^b)$, or a sum $\sigma_1(\beta^a) + \sigma_2(\beta^b)$ of zero.

Figure 8:
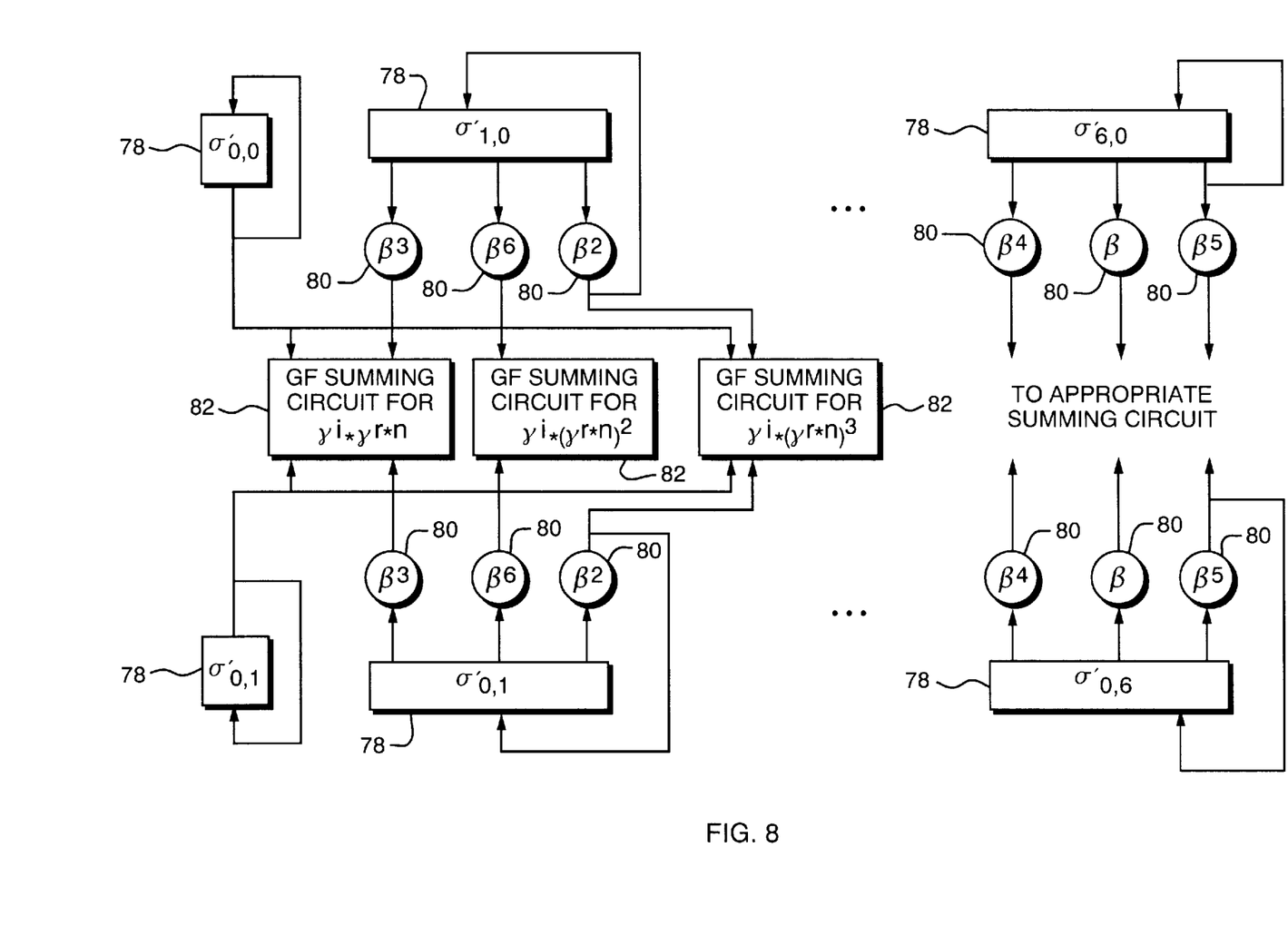
FIG. 8 is a functional block diagram of the Chien Search circuit of FIG. 7 for use with multiple elements of $GF(2^{nm})$.

To test two elements $\gamma^1 * \gamma^{r^*n}$ and $\gamma^i * (\gamma^{r^*n})^2$ simultaneously, the system includes an additional set of $2(v-1)$ constant $GF(2^3)$ multipliers with $v-1$ multipliers used to test $\gamma^i * (\gamma^{r^*n})$ as a root of $\sigma_0(x)$ and $v-1$ multipliers used to test $\gamma^i * (\gamma^{r^*n})^2$ as a root of $\sigma_1(x)$. If the element $\gamma^i * \gamma^{(r^*n)3}$ is also simultaneously tested, an additional set of $2(v-1)$ constant $GF(2^3)$ multipliers are included, and so forth. A system to simultaneously test three possible roots over $GF(2^3)^2$ is depicted in FIG. 8. The coefficient terms of $\sigma_1(x)$ and $\sigma_0(x)$ are supplied to registers 78 and the terms are iteratively multiplied in multipliers 80 by the appropriate elements of $GF(2^m)$ to simultaneously test as roots elements $\gamma^i * \gamma^{r^*n}$, $\gamma^i * (\gamma^{r^*n})^2$ and $\gamma^i * (\gamma^{r^*n})^3$. The results are added in the appropriate GF summing circuits 82, to produce three sums, one for each element tested. If a sum is zero, the associated element is determined to be a root. The system, which includes 36 $GF(2^3)$ multipliers, is less complex than a system that requires $3(t-1)$ $GF(2^6)$ multipliers, or in the example, 36 $GF(2^6)$ multipliers. The system of FIG. 8 can simultaneously test as roots a maximum of $2^m - 1$ elements if $GF(2^m)$ is the selected subfield, or $2^{n-1}$ elements if $GF(2^n)$ is the selected subfield.

The multipliers 80 of FIG. 8 can be simplified by combining the three multipliers associated with a given register 78 into a single multiplier and eliminating various adders, or XOR gates, as discussed above with reference to FIG. 3.

The system of FIG. 8 can be used with other $GF(2^6)$ that are generated using different polynomials and have elements $\alpha^i$ that are not isomorphic to $\gamma^k$. The elements of the form $(0, \beta^a)$ and $(\beta^b, 0)$ of the field of interest are mapped to the various elements $(\gamma^{r^*n})^j$, and when a root is found using the system, an inverse mapping or transformation is then performed to determine the corresponding element of the $GF(2^6)$ of interest. The inverse mapping is performed with a constant multiplier similar to the multiplier discussed above with reference to FIG. 2. This system is thus still less complex than a conventional system that uses $t-1$ $GF(2^6)$ multipliers to simultaneously test each additional element of $GF(2^6)$.

What is claimed is:

1. A system for determining the locations of erroneous symbols in a data code word over $GF(2^P)$ by simultaneously testing j elements of $GF(2^P)$ as possible roots of an associated degree-t error locator polynomial $\sigma(x)$, the system including:

A. a plurality of multipliers that simultaneously produce coefficients of the terms of $\sigma(x)$ for j elements of $GF(2^P)$;

B. summing circuitry that adds together the respective terms of $\sigma(x)$ for each of j elements tested and produces j corresponding sums;

C. evaluation circuitry that for each element tested evaluates the associated sum, and for each element that is a root associates with the element an erroneous data code word symbol; and D. a feedback system that at a next clock cycle supplies the coefficients of $\sigma(x)$ for one element tested in the previous clock cycle to the multipliers, such that the multipliers simultaneously produce updated coefficients associated with j additional elements of $GF(2^P)$.

2. The system of claim 1 wherein the system tests in a clock cycle $k=1$ the elements $x = \alpha^2, (\alpha^2)^2, (\alpha^2)^3 \ldots (\alpha^2)^j$; and in clock cycles $k=2 \ldots (2^P-1)/j$ tests the elements $\alpha^{2*}(\alpha^2)^{j(k-1)}, (\alpha^2)^{2*}(\alpha^2)^{j(k-1)} \ldots (\alpha^2)^{i*}(\alpha^2)^{j(k-1)}$.

3. The system of claim 2 wherein the system includes $t-1$ multipliers over $GF(2^P)$ and each multiplier includes one or more adders that are configured in accordance with precomputed terms of $\sigma(x)$ for $x = \alpha^2, (\alpha^2)^2, (\alpha^2)^3 \ldots (\alpha^2)^j$ based on weight-one elements of $GF(2^P)$.

4. The system of claim 3 wherein duplicated adders, or XOR gates, are eliminated by producing updated coefficients as combinations of other updated coefficients.

5. The system of claim 1 wherein the system includes $t-1$ multipliers that multiply elements of $GF(2^P)$ by elements of $GF(2^m)$ to produce the coefficients of $\sigma(x)$.

6. The system of claim 1 wherein the system includes i. $n(2^m-2)$ multipliers over $GF(2^m)$, where $P=nm$, each multiplier producing a coefficient of a term of one of n expressions of $\sigma(x)$; and ii. the summing circuitry produces one or more sums that correspond to the n expressions for $\sigma(x)$.

7. The system of claim 6 further including iii. multiple sets of $n(2^m-2)$ multipliers to simultaneously test multiple elements of $GF(2^{mn})$ as possible roots, and iv. the summing circuitry produces for each element tested a corresponding one or more sums.

8. A system for determining the locations of erroneous symbols in a data code word over $GF(2^{mn})$ by testing elements of $GF(2^{mn})$ as possible roots of an associated degree-t error locator polynomial $\sigma(x)$, the system including:

A. $n(2^m-2)$ multipliers over $GF(2^m)$, each multiplier producing a coefficient of a term of one of n expressions of $\sigma(x)$ for $x=\alpha^i$;

B. summing circuitry that produces one or more sums that correspond to the n expressions for $\sigma(x)$;

C. evaluation circuitry that determines that an element is a root if the associated one or more sums are equal to zero, the evaluation circuitry associating the root with an erroneous data code word symbol; and D. a feedback system that at a next clock cycle supplies to the respective multipliers coefficients produced in the previous clock cycle, wherein the system tests a next element as a possible root.

9. The system of claim 8 further including

E. multiple sets of $n(2^m-2)$ multipliers to simultaneously test multiple elements of $GF(2^{mn})$ as possible roots, and F. the summing circuitry produces for each element a corresponding sum.

* * * * *